(12) United States Patent
You

(10) Patent No.: US 11,580,028 B2
(45) Date of Patent: Feb. 14, 2023

(54) STORAGE DEVICE AND METHOD OF OPERATING THE SAME

(71) Applicant: SK hynix Inc., Gyeonggi-do (KR)

(72) Inventor: Byoung Sung You, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 135 days.

(21) Appl. No.: 16/902,840

(22) Filed: Jun. 16, 2020

(65) Prior Publication Data

US 2021/0191873 A1 Jun. 24, 2021

(30) Foreign Application Priority Data

Dec. 19, 2019 (KR) ........................ 10-2019-0171242

(51) Int. Cl.
| | |
|---|---|
| *G06F 12/08* | (2016.01) |
| *G06F 12/0882* | (2016.01) |
| *G06F 12/02* | (2006.01) |
| *G11C 16/26* | (2006.01) |
| *G11C 7/10* | (2006.01) |
| *G11C 16/16* | (2006.01) |

(52) U.S. Cl.
CPC ...... *G06F 12/0882* (2013.01); *G06F 12/0246* (2013.01); *G06F 12/0292* (2013.01); *G11C 7/106* (2013.01); *G11C 7/1087* (2013.01); *G11C 16/16* (2013.01); *G11C 16/26* (2013.01); *G06F 2212/7201* (2013.01)

(58) Field of Classification Search
CPC ......... G06F 12/0246; G06F 2212/7201; G06F 12/0882; G06F 12/0292; G11C 7/106; G11C 7/1087; G11C 16/16; G11C 16/26
USPC ....................................................... 711/154
See application file for complete search history.

(56) References Cited

U.S. PATENT DOCUMENTS

| | | | |
|---|---|---|---|
| 9,159,422 B1 * | 10/2015 | Lee ........................ | G11C 16/10 |
| 2007/0288702 A1 * | 12/2007 | Roohparvar ....... | G11C 16/0483 |
| | | | 711/154 |
| 2011/0149650 A1 * | 6/2011 | Huang ................ | G06F 12/0246 |
| | | | 365/185.08 |

(Continued)

FOREIGN PATENT DOCUMENTS

KR    10-2016-0063493    6/2016

OTHER PUBLICATIONS

Won et al., "SLC Buffer Performance Improvement using Page Overwriting Method in TLC NAND Flash-based Storage Devices", Journal of The Institute of Electronics and Information Engineers, Jan. 2016, pp. 36-42, vol. 53, No. 1, The Institute of Electronics Engineers of Korea, Republic of Korea.

*Primary Examiner* — Hua J Song
(74) *Attorney, Agent, or Firm* — IP & T Group LLP

(57) ABSTRACT

The present technology relates to an electronic device. A memory device having improved memory block management performance according to the present technology includes a memory block, a peripheral circuit, and a control logic. The peripheral circuit performs a read operation and a program operation on a selected physical page among a plurality of physical pages. The control logic controls the peripheral circuit to read first logical page data stored in a first physical page and second logical page data stored in a second physical page among the plurality of physical pages, and additionally program the second logical page data into the first physical page using the read first and second logical page data.

20 Claims, 14 Drawing Sheets

(56) References Cited

U.S. PATENT DOCUMENTS

2014/0204672 A1* 7/2014 Lee .................... G11C 16/0483
365/185.12

* cited by examiner

FIG. 7

| Mapping Table ||
|---|---|
| LOGICAL ADDRESS OF FIRST LOGICAL PAGE DATA | FIRST AREA PHYSICAL ADDRESS |
| LOGICAL ADDRESS OF SECOND LOGICAL PAGE DATA | SECOND AREA PHYSICAL ADDRESS |
| LOGICAL ADDRESS OF THIRD LOGICAL PAGE DATA | THIRD AREA PHYSICAL ADDRESS |

⇩ In-place Merge

| Mapping Table ||
|---|---|
| LOGICAL ADDRESS OF FIRST LOGICAL PAGE DATA | FIRST AREA PHYSICAL ADDRESS |
| LOGICAL ADDRESS OF SECOND LOGICAL PAGE DATA | SECOND AREA PHYSICAL ADDRESS (Invalid) |
| LOGICAL ADDRESS OF THIRD LOGICAL PAGE DATA | THIRD AREA PHYSICAL ADDRESS (Invalid) |

⇩ Re-mapping

| Mapping Table ||
|---|---|
| LOGICAL ADDRESS OF FIRST LOGICAL PAGE DATA | FIRST AREA PHYSICAL ADDRESS |
| LOGICAL ADDRESS OF SECOND LOGICAL PAGE DATA | FIRST AREA PHYSICAL ADDRESS |
| LOGICAL ADDRESS OF THIRD LOGICAL PAGE DATA | FIRST AREA PHYSICAL ADDRESS |

Valid

Invalid

STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0171242, filed on Dec. 19, 2019, which is incorporated herein by reference in its entirety.

BACKGROUND

Field of Invention

The present disclosure relates to an electronic device, and more particularly, to a storage device and a method of operating the same.

Description of Related Art

A storage device stores data under the control of a host device such as a computer or a smartphone. A storage device may include a memory device for storing the data and a memory controller for controlling the storing of the data in the memory device. A memory device may be categorized as a volatile memory device or a non-volatile memory device.

A volatile memory device stores data only when its power supply is on and loses the stored data when its power supply is cut off. Examples of volatile memory devices include a static random-access memory (SRAM), a dynamic random-access memory (DRAM), and the like.

A non-volatile memory does not lose data even when its power supply is cut off. Examples of non-volatile memory devices include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a storage device exhibiting improved memory block management performance, and a method of operating the same.

A memory device according to an embodiment of the present disclosure includes a memory block including a plurality of physical pages, a peripheral circuit, and a control logic. The peripheral circuit performs a read operation and a program operation on a selected physical page among the plurality of physical pages. The control logic controls the peripheral circuit to read first logical page data stored in a first physical page and second logical page data stored in a second physical page among the plurality of physical pages, and additionally program the second logical page data into the first physical page using the read first and second logical page data.

A memory device according to an embodiment of the present disclosure includes a memory block, a peripheral circuit, and a control logic. The peripheral circuit performs a read operation and a program operation on the memory block. The control logic controls the peripheral circuit to program first data, which is stored in the memory block in a first program method, into a first area of the memory block in a second program method. The first program method is a program method of storing n bits, where n is a natural number equal to or greater than 1, in one memory cell, and the second program method is a program method of storing m bits, where m is a natural number greater than n, in one memory cell.

A storage device according to an embodiment of the present disclosure includes a memory device and a memory controller. The memory device includes a plurality of memory blocks. The memory controller controls the memory device to perform an in-place merge operation of programming first data stored in a target block among the plurality of memory blocks into a first area of the target block in a second program method. The first program method is a program method of storing n bits, where n is a natural number equal to or greater than 1, in one memory cell, and the second program method is a program method of storing m bits, where m is a natural number greater than n, in one memory cell.

According to the present technology, the storage device having improved memory block management performance, and a method of operating the same are provided.

These and other features and advantages of the application will be further described with specific embodiments in the detailed description in conjunction with the following drawings.

BRIEF DESCRIPTION OF THE DRAWINGS

FIG. 7 is a simplified schematic diagram of a mapping table update operation according to the in-place merge operation of FIG. 6.

DETAILED DESCRIPTION

Hereinafter, the present disclosure will be described in detail by describing a various embodiment of the present disclosure with reference to the accompanying drawings.

Figure 1:
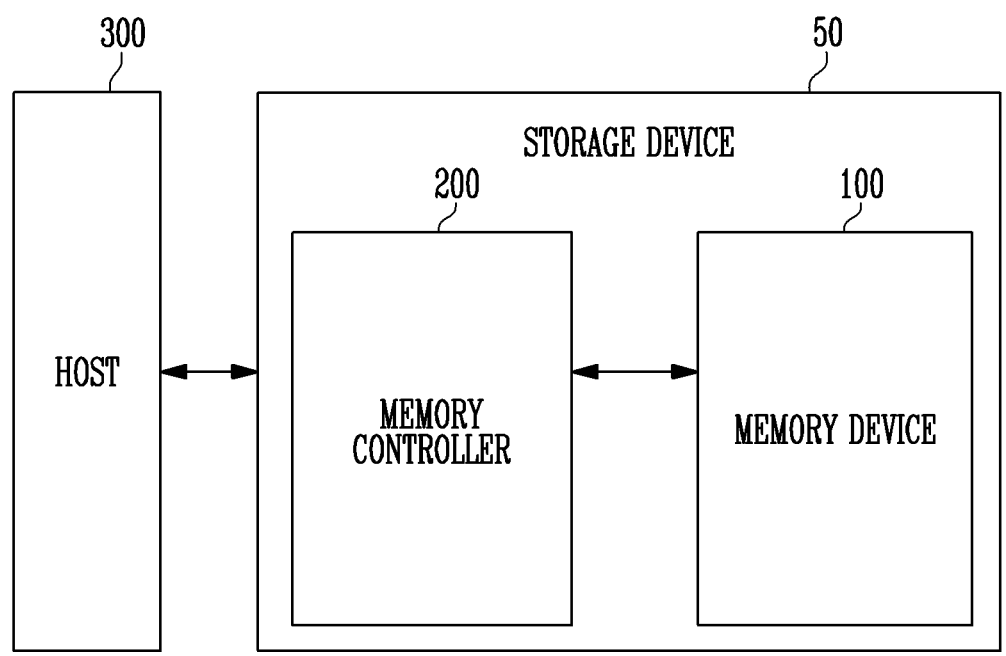
FIG. 1 is a simplified block diagram of a storage device according to an embodiment of the present disclosure.

FIG. 1 is a simplified block diagram of a storage device 50 operatively coupled to a host 300 according to an embodiment of the present disclosure.

Referring to FIG. 1, the storage device 50 may include a memory device 100 and a memory controller 200 that controls an operation of the memory device. The storage device 50 stores data under control of the host 300. The host may be any electronic device such as, for example, a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with a host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multichip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 is configured to receive a command and an address from the memory controller 200 and access an area selected by the address of the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During a read operation, the memory device 100 may read data from the area selected by the address. During an erase operation, the memory device 100 may erase data stored in the area selected by the address.

The memory controller 200 controls the overall operations of the storage device 50.

When power is applied to the storage device 50, the memory controller 200 may execute firmware for controlling communication between the host and the memory device 100. In an embodiment, the memory device 100 may be a flash memory device, and the memory controller 200 may operate a firmware such as a flash translation layer (FTL) for controlling communication between the host and the memory device 100.

In an embodiment, the memory controller 200 may receive data and a logical block address (LBA) from the host and convert the logical block address (LBA) into a physical block address (PBA) indicating an address of memory cells in which data included in the memory device 100 is to be stored.

The memory controller 200 may control the memory device 100 to perform the program operation, the read operation, or the erase operation in response to a request from the host. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host. For example, the memory controller 200 may provide a command, an address, and data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving method to improve operation performance. The interleaving method may be an operation method for overlapping operation periods of at least two memory devices 100.

In an embodiment, the memory controller 200 may control the memory device 100 to read first data stored in a target block among the plurality of memory blocks in a first program method. The memory controller 200 may control the memory device 100 to program the read first data in a first area of the target block in a second program method. The first program method may include one memory cell stores n bits, where n is a natural number equal to or greater than 1, and the second program method may include one memory cell storing m bits, where m is greater than n.

As will be described later with reference to FIG. 8, the first data may be stored in the first area through the first program method, then may be read from the first area and then may be merged and stored back in the first area through the second program method. As described above, an operation of reading the data stored in the target block and reprogramming the read data into a portion of the target block through a changed program method may be referred to as an in-place merge operation.

As the in-place merge operation is performed, the memory controller 200 may update a physical address mapped with a logical address of the first data in a mapping table that stores map data for the target block.

The memory controller 200 may control the memory device 100 to erase a remaining second area except for the first area of the target block. The memory controller 200 may control the memory device 100 to program second data into the erased second area of the target block in the first program method. In another embodiment, when a size of the second area is less than a threshold size, the memory controller 200 may control the memory device 100 to program the second data into the second area in the second program method. For example, the number of pages included in the second area is less than the number of pages corresponding to the threshold size, the memory controller 200 may control the memory device 100 to program the second data into the second area in the second program method.

The memory controller 200 may control the memory device 100 to program the second data stored in the second area into a third area that is a portion of the second area in the second program method. The memory controller 200 may control the memory device 100 to erase a remaining fourth area except for the third area of the second area.

As described above, the memory controller 200 may control the memory device 100 to recursively perform the in-place merge operation on the target block. The target block that initially stores data in the first program method may be changed to a second memory block that stores data in the second program method as the in-place merge operation is repeated. The in-place merge operation for the target block may be repeatedly performed until the target block is completely changed to the second memory block programmed in the second program method.

In an embodiment of the disclosure, the first memory block may have data stored therein wholly through the first program method while the second memory block may have data stored therein wholly through the second program method. The target block may be selected among the first memory block and may ultimately become the second memory block according to the progressive iteration of the in-place merge operation thereon.

In an embodiment, when the number of first memory blocks programmed in the first program method among the plurality of memory blocks reaches a threshold number, the memory controller 200 may select a target block among the first memory blocks. The memory controller 200 may control the memory device 100 to perform the in-place merge operation on the selected target block. Therefore, the target block may be changed from the first memory block to the second memory block, and the number of first memory blocks among all memory blocks in the memory device 100 may be reduced.

In an embodiment, the threshold number may be determined according to a storage area management policy of the memory device 100. For example, a storage management policy may take into account the relative storage capacity and programming/reading speed of the memory blocks. For example, when the memory cells of the first memory block store a bit less than that the memory cells of the second memory block (e.g. 1-bit cells v. 2-bit cells, or 2-bit cells v. 3-bit cells, etc.), a program speed and a read speed of the first memory block may be higher than the program speed and read speed of the second memory block, but a storage capacity of the first memory block may be smaller than the storage capacity of the second memory block.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
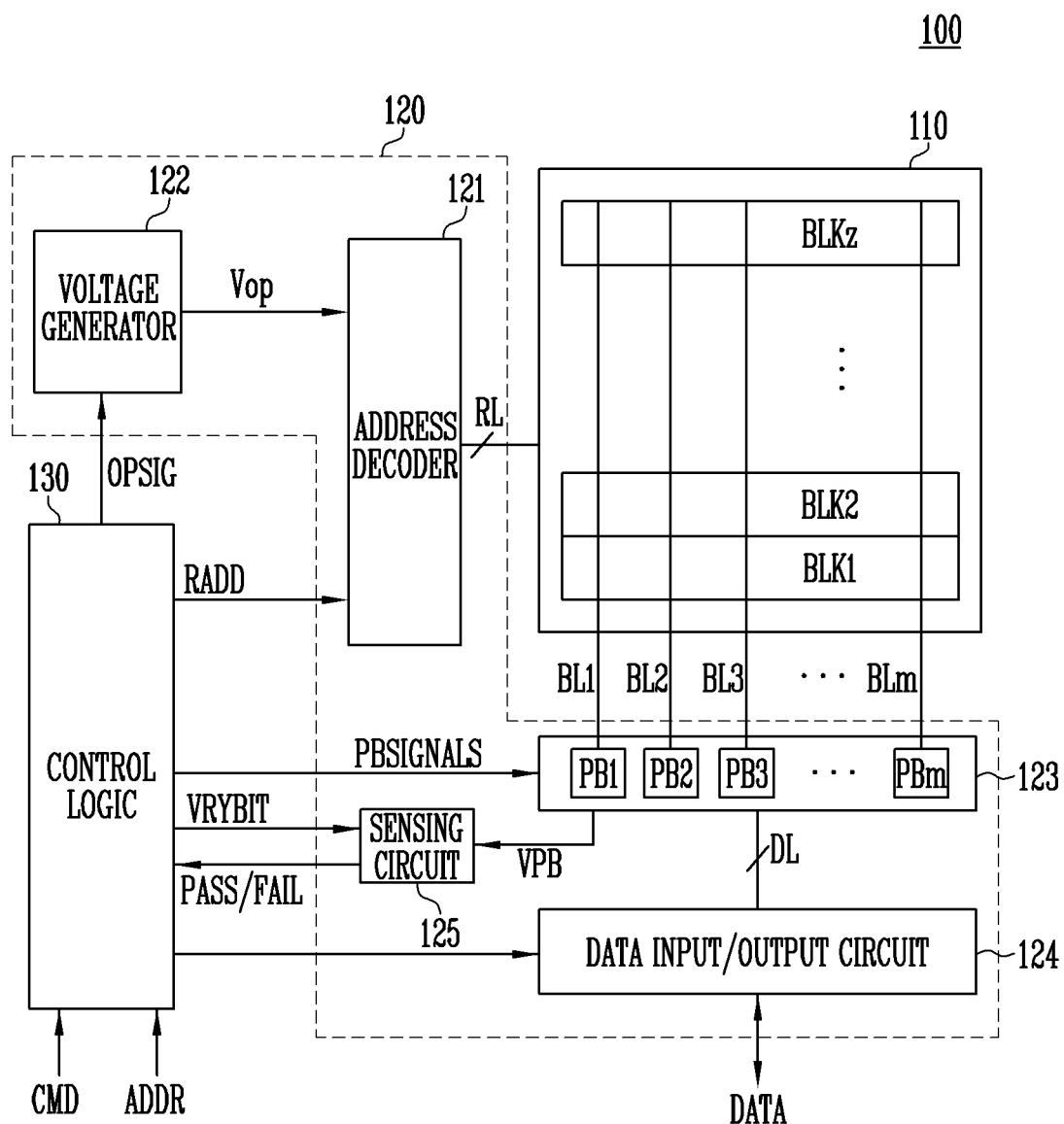
FIG. 2 is a diagram of a structure of a memory device of FIG. 1.

FIG. 2 describes an example of a structure of the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. In an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells, and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line of a selected memory block by applying voltages supplied from the voltage generator 122 to at least one word line WL according to the decoded row address.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as an operation voltage of the memory device 100.

In an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. In an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, a read and write circuit control signal PBSIGNALS, and the permission bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

Figure 3:
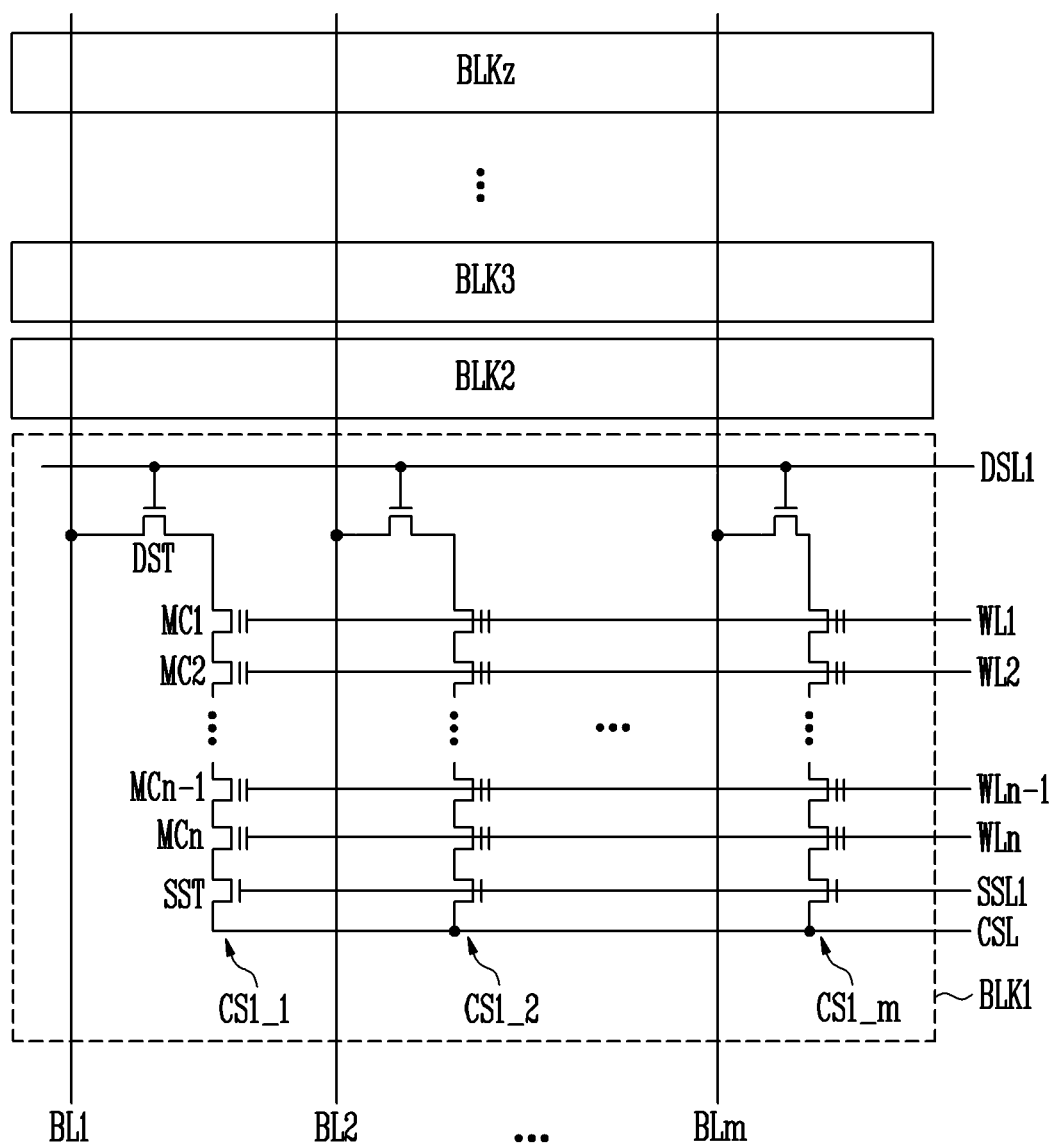
FIG. 3 is a circuit diagram of a memory cell array of FIG. 2.

FIG. 3 is a circuit diagram of the memory cell array of FIG. 2.

Referring to FIG. 3, the first to z-th memory blocks BLK1 to BLKz are commonly connected to the first to m-th bit lines BL1 to BLm. In FIG. 3, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The memory block BLK1 may include a plurality of cell strings CS1_1 to CS1_m, where m is a positive integer. The first to m-th cell strings CS1_1 to CS1_m are connected to the first to m-th bit lines BL1 to BLm, respectively. Each of the first to m-th cell strings CS1_1 to CS1_m includes a drain select transistor DST, a plurality of memory cells MC1 to MCn connected in series, where n is a positive integer, and a source select transistor SST.

Gate terminals of the drain select transistors DST included in each of the first to m-th cell strings CS1_1 to CS1_m are connected to a drain select line DSL1. Gate terminals of the first to n-th memory cells MC1 to MCn included in each of the first to m-th cell strings CS1_1 to CS1_m are connected to the first to n-th word lines WL1 to WLn, respectively. Gate terminals of the source select transistors SST included in each of the first to m-th cell strings CS1_1 to CS1_m are connected to a source select line SSL1.

For convenience of description, a structure of the cell string will be described with reference to the first cell string CS1_1 of the plurality of cell strings CS1_1 to CS1_m. However, it will be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. In an embodiment, the common source line CSL may be commonly connected to the first to z-th memory blocks BLK1 to BLKz.

The drain select line DSL1, the first to n-th word lines WL1 to WLn, and the source select line SSL1 are included in row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
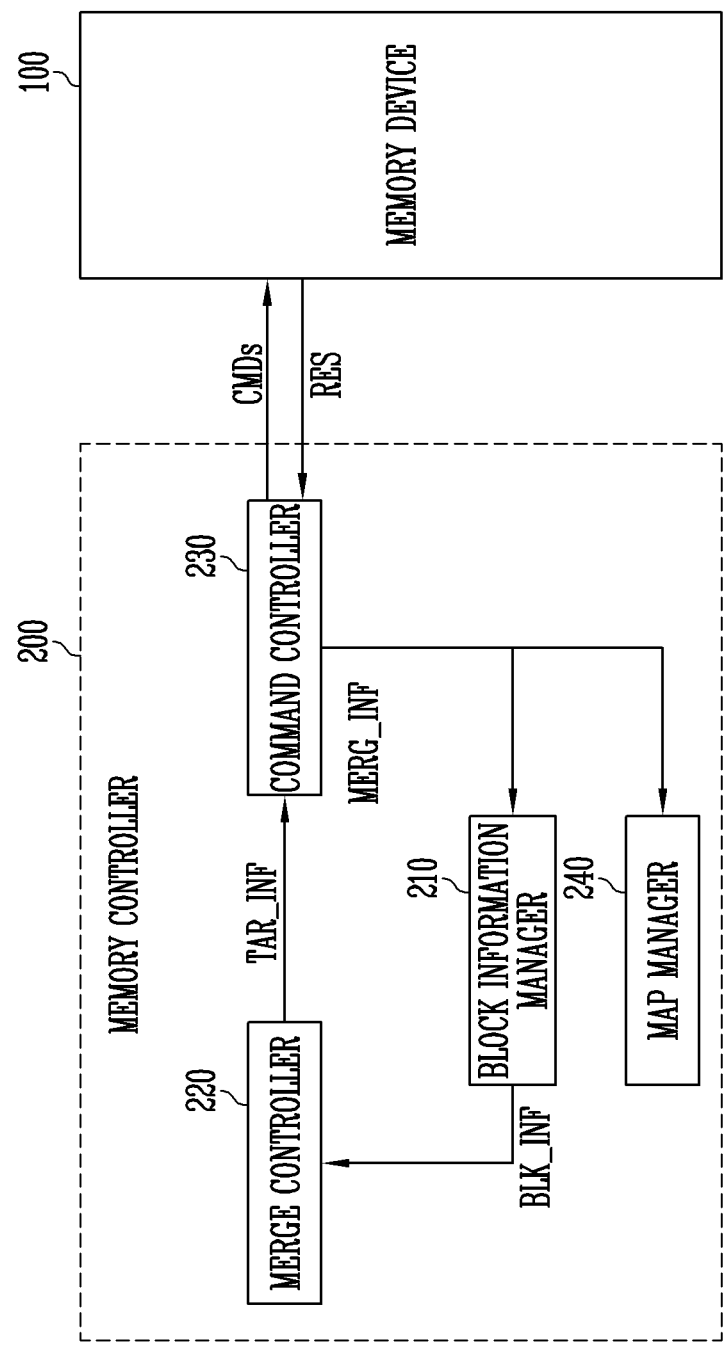
FIG. 4 is a simplified block diagram illustrating a configuration and an operation of a memory controller of FIG. 1.

FIG. 4 is a simplified block diagram of a configuration and an operation of the memory controller of FIG. 1.

Referring to FIG. 4, the memory device 100 may include a plurality of memory blocks.

In an embodiment, the plurality of memory blocks may include a first memory block programmed according to a first program method and a second memory block programmed according to a second program method. In a first program method, one memory cell may store n bits, where n is a natural number equal to or greater than 1. In a second program method, one memory cell may store m bits, where m is greater than n. Since a memory cell of the first memory block stores a bit less than that of a memory cell of the second memory block, a program speed and a read speed of the first memory block are higher than those of the second memory block, but a storage capacity of the first memory block may be smaller than that of the second memory block.

The memory controller 200 may include a block information manager 210, a merge controller 220, a command controller 230, and a map manager 240.

The block information manager 210 may manage information on the plurality of memory blocks included in the memory device 100. Specifically, the block information manager 210 may store block information BLK_INF on the first memory blocks among the plurality of memory blocks. The block information manager 210 may update the block information BLK_INF based on merge information MERG_INF received from the command controller 230.

For example, when the target block is changed from the first memory block to the second memory block through the in-place merge operation, the block information manager 210 may exclude information on the corresponding target block from the block information BLK_INF.

The block information manager 210 may provide the block information BLK_INF to the merge controller 220.

The merge controller 220 may determine whether the number of first memory blocks included in the memory device 100 reaches the threshold number based on the block information BLK_INF.

When the number of first memory blocks reaches the threshold number, the merge controller 220 may provide target block information TAR_INF indicating a block on which the in-place merge operation is performed among the first memory blocks, to the command controller 230.

The in-place merge operation may include reading data stored in the target block and reprogramming the read data to a partial area of the target block by changing a program method. As described later with reference to FIG. 8, the target block may be changed from the first memory block to the second memory block through a recursive in-place merge operation for a free area of the target block. Therefore, the number of first memory blocks may be adjusted through the in-place merge operation.

In an embodiment, the threshold number may be determined according to the storage capacity management policy of the memory device 100 as, for example, in consideration of a high program speed and small storage capacity of the first memory block in comparison with the second memory block.

For example, since the number of memory blocks used as the second memory block decreases as the number of memory blocks used as the first memory block increases, an available storage capacity of the memory device 100 may decrease. That is, an over-provisioning area for managing the memory device 100 may be insufficient, and thus reliability and performance of the memory device 100 may be degraded. On the other hand, since the first memory block has a program speed and a read speed faster than those of the second memory block, write and read operation performance of the memory device 100 may be improved.

On the contrary, since the number of memory blocks used as the second memory block increases as the number of memory blocks used as the first memory block decreases, the available storage capacity of the memory device 100 may increase. That is, the over-provisioning area for managing the memory device 100 may be secured, and thus the reliability and performance of the memory device 100 may be improved. On the other hand, since the second memory block has a lower program speed and read speed than those of the first memory block, the write and read operation performance of the memory device 100 may be degraded.

The command controller 230 may provide a command for performing the in-place merge operation under the control of the merge controller 220, to the memory device 100. The command controller 230 may provide a command for the target block to the memory device 100 based on the target block information TAR_INF.

For example, the command controller 230 may provide a read command for reading the first data stored in the target block according to the first program method, to the memory device 100. The read command may be a command for reading the first data stored in the target block and storing the first data in the read and write circuit of the memory device 100 described with reference to FIG. 2.

The command controller 230 may provide a program command for storing the read first data in the first area of the target block again, to the memory device 100. Specifically, the program command may be a command for reprogramming the first data stored in the read and write circuit of the memory device 100 into the first area of the target block in the second program method. The remaining second area except for the first area of the target block may be changed to the free area that does not store valid data.

The command controller 230 may provide a command for erasing the second area, which is the free area of the target block after the in-place merge operation is completed, to the memory device 100. In an embodiment, the erase command may be a command for erasing a portion of the memory block.

Thereafter, the command controller 230 may provide a program command for storing the second data in the second area, which is the free area, in the first program method, to the memory device 100.

In another embodiment, when a size of the second area, which is the free area, is less than a threshold size, the command controller 230 may provide a program command for storing the second data in the second area in the second program method, to the memory device 100.

This is because, when the size of the free area is less than the threshold size, thereafter, directly programming the data into the free area in the second program method is more efficient than recursively performing the in-place merge operation. For this reason, the threshold size may be determined in consideration of the cost of performing the in-place merge operation and the cost of directly programming the data into the free area in the second program method.

When the command controller 230 receives the target block information TAR_INF again, the command controller 230 may provide a command for recursively performing the in-place merge operation on the target block, to the memory device 100. Details related to the recursive performance of the in-place merge operation will be described later with reference to FIG. 8.

The command controller 230 may receive a response RES indicating a result of the memory device 100 performing an operation according to a command, from the memory device 100. In an embodiment, the command controller 230 may determine a result of the in-place merge operation performed by the memory device 100 through the response RSPN.

The command controller 230 may generate merge information MERG_INF indicating a merge process result according to the in-place merge operation. The command controller 230 may provide the merge information MERG_INF to the block information manager 210 and the map manager 240.

The map manager 240 may update a mapping table including map data of the data stored in the target block based on the merge information MERG_INF. Details of the update of the mapping table will be described in detail with reference to FIG. 7.

Figure 5:
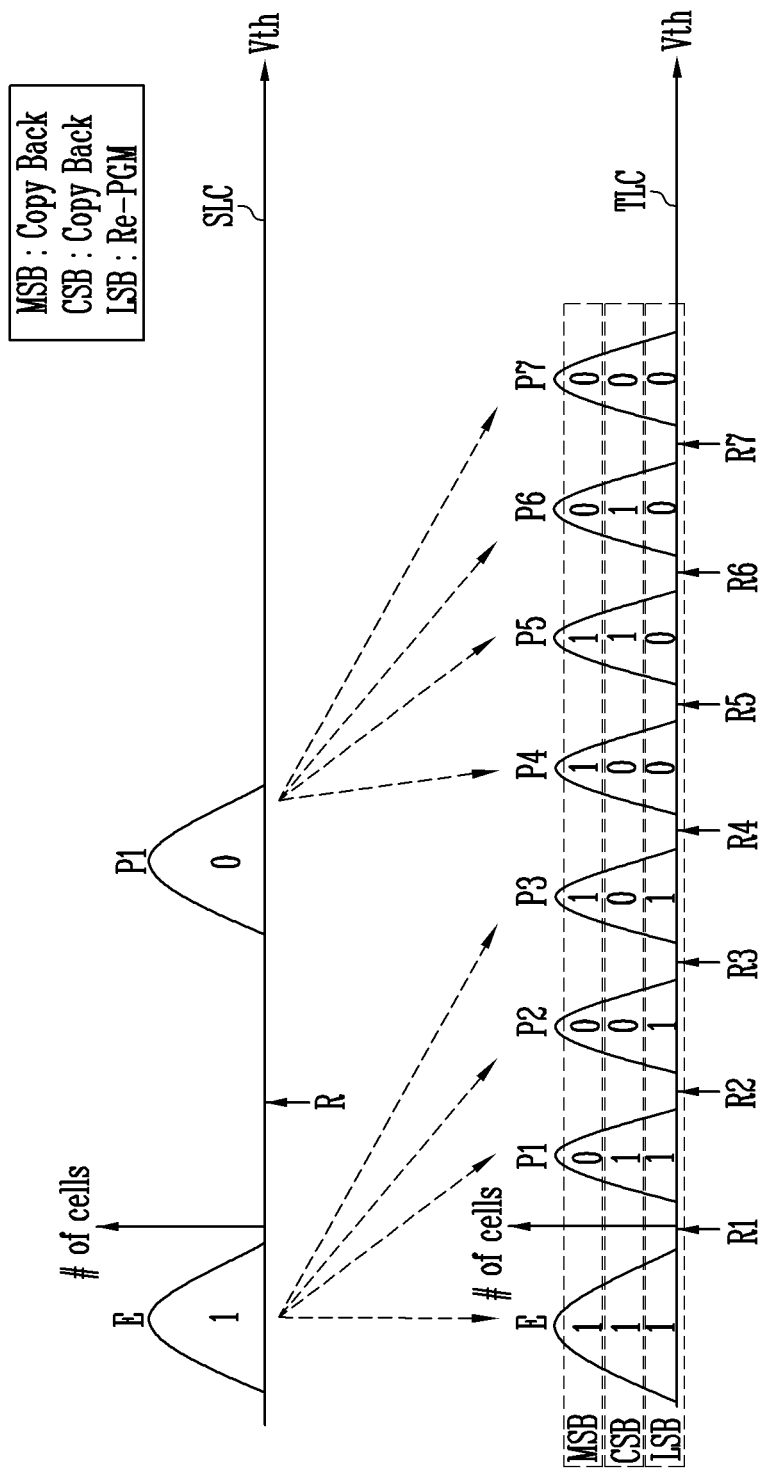
FIG. 5 is a threshold voltage distribution diagram according to a program method.

FIG. 5 is a diagram of a threshold voltage distribution according to the program method.

Referring to FIG. 5, the first program method may be a single level cell (SLC) program method in which one memory cell stores one bit. The second program method may be a triple level cell (TLC) program method in which one memory cell stores 3 bits. The second program method may be slower than the first program method, however, the number of data bits stored in one memory cell in the second program method may be greater than that of the first program method. The number of data bits stored in the memory cell according to each program method is not limited to the present embodiment.

In a case of the first program method, the memory cell may be programmed to one of an erase state E and a program state P1. A voltage R may be a read voltage for dividing the erase state E and the program state P1. Each of the erase state E and the program state P1 indicates one data bit.

In a case of the second program method, the memory cell may be programmed to any one of the erase state E and first to seventh program states P1 to P7. Each of voltages R1 to R7 may be a read voltage for dividing two adjacent states. Each of the erase state E and the first to seventh program states P1 to P7 indicates three data bits.

In an embodiment, a memory cell programmed in the first program method may be reprogrammed in the second program method based on additional input data.

The description will be given based on the memory cell programmed in the first program method storing its original data. The original data may be re-stored in the memory cell as least significant bit (LSB) data through the second program method. The memory cell may be programmed, together with the LSB data, with additional data as most significant bit (MSB) data and central significant bit (CSB) data through the second program method.

A memory cell programmed into the erase state E by the first program method may be reprogrammed into any one of the erase state E and the first to third program states P1 to P3 by the second program method. A memory cell programmed into the first program state P1 by the first program method may be reprogrammed to any one of the fourth to seventh program states P4 to P7 by the second program method.

As described above, the memory device may merge and store the MSB data and the CSB data in a memory cell storing the LSB data by changing the program method. That is, the memory device may store data obtained by merging existing stored data and additional data in the memory cell by changing the program method.

Figure 6:
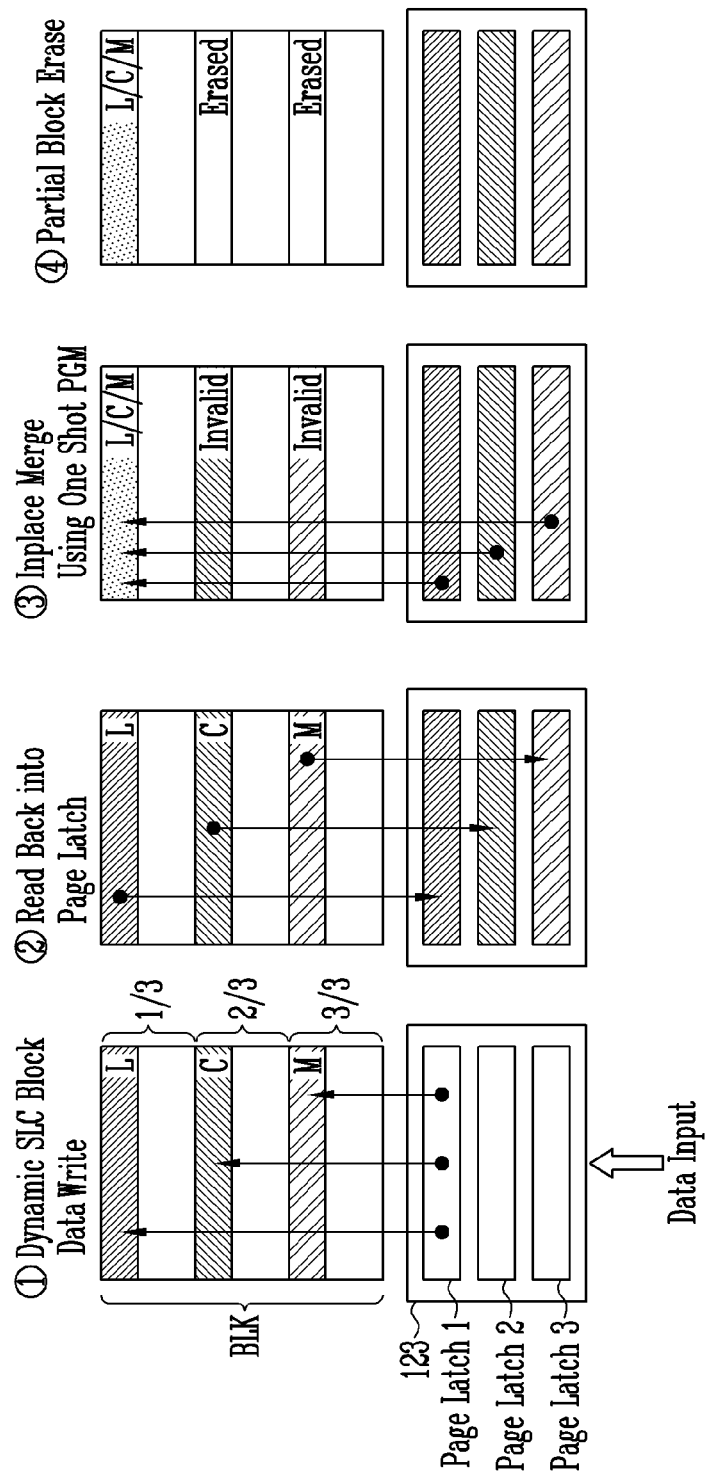
FIG. 6 is a simplified schematic diagram of an in-place merge operation performed in a page unit.

FIG. 6 is a diagram for describing the in-place merge operation performed in a page unit.

Referring to FIG. 6, a dynamic buffer block may be used as a buffer block or a main block according to an operation environment of the memory device. The buffer block may be a memory block that stores data in the first program method. The main block may be a memory block that stores data in the second program method.

The first program method may include one memory cell stores n bits, where n is a natural number equal to or greater than 1. The second program method may include one memory cell storing m bits, where m is a natural number greater than n.

In FIG. 6, n is 1 and m is 3. The dynamic buffer block may be a dynamic SLC block. The first program method may be the SLC program method. The second program method may be the TLC program method. However, values of n and m are not limited to the present embodiment.

The target block BLK on which the in-place merge operation is to be performed among the dynamic SLC blocks may be divided into three areas according to the number of data bits stored in each memory cell in the TLC program method. The first area may be an area in which first logical page data LSB is stored. The second area may be an area in which second logical page data CSB is stored. The third area may be an area in which third logical page data MSB is stored.

The read and write circuit 123 described with reference to FIG. 2 may include a plurality of page latches Page Latch 1 to Page Latch 3. The number of page latches included in the read and write circuit 123 is not limited to the present embodiment.

Each of the page latches may store logical page data read from a physical page of the target block BLK. Each of the page latches may store logical page data to be programmed into the physical page of the target block BLK.

In an embodiment, first to third logical page data to be stored in the target block BLK may be input to the read and write circuit 123. Each logical page data may be sequentially programmed into the target block BLK through the first page latch Page Latch 1. At this time, each logical page data may be divided and stored in first to third areas of the target block BLK in the first program method (①).

Specifically, the first logical page data LSB may be stored in a first physical page in the first program method. The second logical page data CSB may be stored in a second physical page in the first program method. The third logical page data MSB may be stored in a third physical page in the first program method. The first physical page may be included in the first area, the second physical page may be included in the second area, and the third physical page may be included in the third area.

In FIG. 6, the in-place merge operation may include merging and storing a plurality of logical page data stored in a plurality of physical pages, in one physical page ((②) and (③)).

The first to third logical page data respectively stored in the first to third physical pages may be read to corresponding first to third page latches Page Latch 1 to Page Latch 3 ((②)).

Thereafter, a one shot program operation may be performed on the first physical page according to the second program method based on the first to third logical page data stored in the first to third page latches Page Latch 1 to Page Latch 3.

That is, the second logical page data CSB and the third logical page data MSB may be additionally programmed in the first physical page storing the first logical page data LSB. The second logical page data CSB stored in the second physical page may be processed as invalid data. The third logical page data MSB stored in the third physical page may be processed as invalid data ((③)).

The first area including valid data may be a data area. The second area and the third area including the invalid data may be changed to the free area. The second area and the third area may be erased through partial block erase ((④)).

FIG. 7 is a diagram of a mapping table update operation according to the in-place merge operation of FIG. 6.

Referring to FIG. 7, the mapping table may include map data between a logical address of logical page data and a physical address in which the logical page data is stored.

The physical address mapped with the logical address of the first logical page data in the mapping table may be a physical address of the first physical page included in the first area. The physical address mapped with the logical address of the second logical page data may be a physical address of the second physical page included in the second area. The physical address mapped with the logical address of the third logical page data in the mapping table may be a physical address of the third physical page included in the third area.

When the in-place merge operation described with reference to FIG. 6 is performed, since the second and third logical page data are newly programmed into the first physical page, map data corresponding to the existing second logical page data and third logical page data may be processed as invalid data.

Therefore, the mapping table may be updated as the in-place merge operation is performed. For example, the physical address mapped with the logical address of the second logical page data may be updated with the physical address of the first physical page included in the first area. The physical address mapped with the logical address of the third logical page data may be updated with the physical address of the first physical page included in the first area.

As described above, in a case of the in-place merge operation, since data stored in the existing area of the memory block is merged and programmed again into some areas of the existing area, the update of the mapping table may be simply and quickly performed.

In a migration operation which will be described later with reference to FIG. 9, since the migration operation is data migration from a victim block to the target block rather than data migration in the memory block, all map data of data stored in the victim block is required to be updated. Therefore, the update of the mapping table may be more complicated and require longer time when the migration operation is performed.

Figure 8:
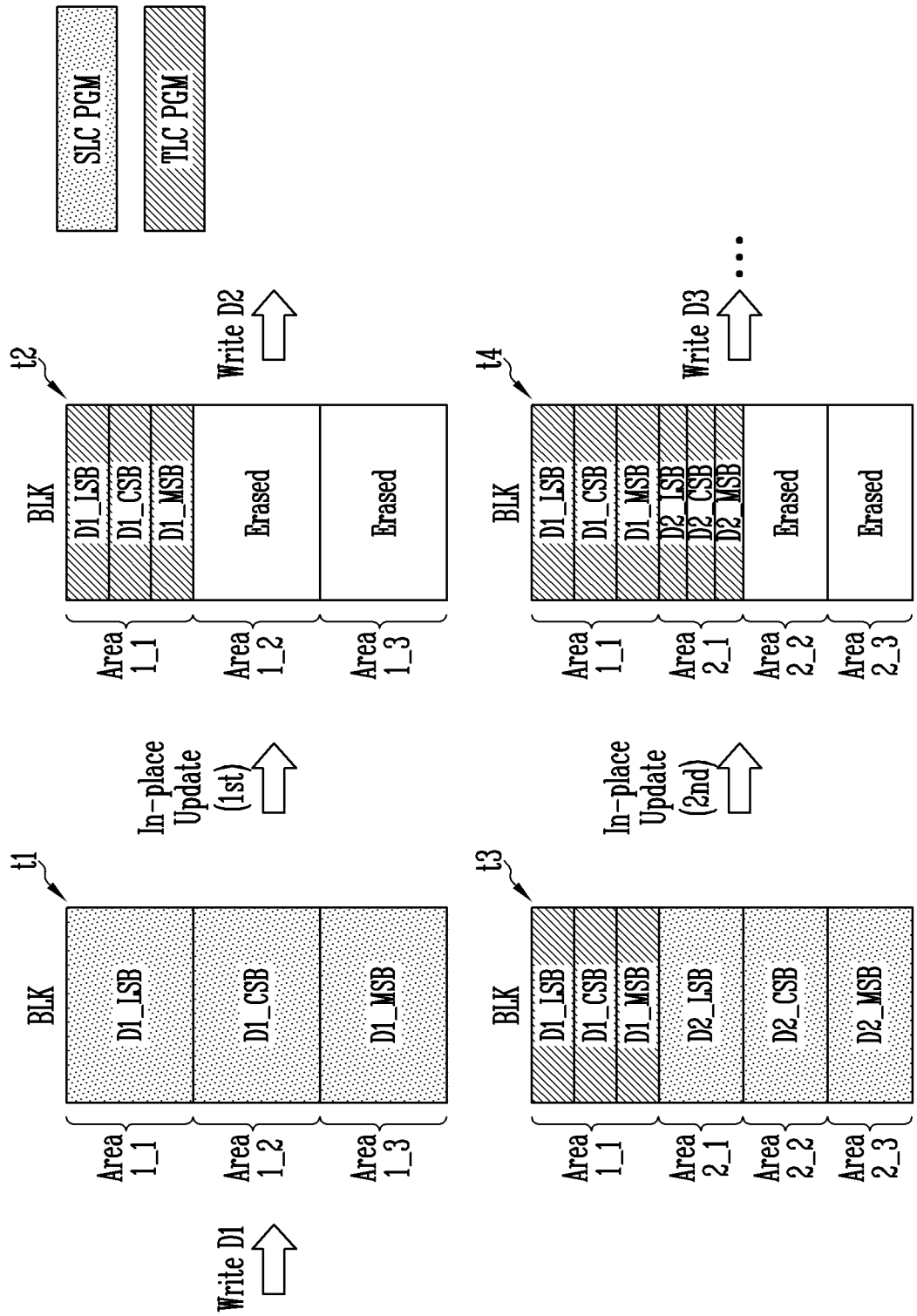
FIG. 8 is a simplified schematic diagram describing the in-place merge operation performed in a partial area unit of a block.

FIG. 8 is a diagram describing the in-place merge operation performed in a partial area unit of a block.

Referring to FIG. 8, the first program method may include one memory cell stores n bits, where n is a natural number equal to or greater than 1. The second program method may include one memory cell storing m bits, where m is a natural number greater than n. In FIG. 8, n is 1 and m is 3.

At a time t1, the target block BLK may be in a state in which first data D1 is programmed in the first program method. The target block BLK may be divided into three areas Area1_1, Area1_2, and Area1_3. First logical page data D1_LSB of the first data may be programmed into the area Area1_1. Second logical page data D1_CSB of the first data may be programmed into the area Area1_2. Third logical page data D1_MSB of the first data may be programmed into the area Area1_3.

At a time t2, the target block BLK may be in a state in which a first in-place merge operation is performed. The first to third logical page data D1_LSB, D1_CSB, and D1_MSB of the first data respectively stored in the areas Area1_1 to Area1_3 may be merged into the area Area1_1 and may be programmed in the second program method. The areas Area1_2 and Area1_3 may be changed to the free area. The areas Area1_2 and Area1_3 may be erased.

At a time t3, the areas Area1_2 and Area1_3 which are the free areas of the target block BLK may be in a state in which second data D2 is programmed in the first program method. Specifically, the areas Area1_2 and Area1_3 may be additionally divided into three areas Area2_1, Area2_2, and Area2_3. First logical page data D2_LSB of the second data may be programmed into the area Area2_1. Second logical page data D2_CSB of the second data may be programmed into the area Area2_2. Third logical page data D2_MSB of the second data may be programmed into the area Area2_3.

At a time t4, the target block BLK may be in a state where a second in-place merge operation is performed. The first to third logical page data D2_LSB, D2_CSB, and D2_MSB of the second data respectively stored in the areas Area2_1 to Area2_3 may be merged into the area Area2_1 and may be programmed in the second program method. The areas Area2_2 and Area2_3 may be changed to the free area. The areas Area2_2 and Area2_3 may be erased.

After the time t4, the third data D2 may be programmed into the areas Area2_2 and Area2_3, which are the free areas of the target block BLK, in the first program method.

In various embodiments, when a size of the free area is equal to or less than a threshold size, data may be programmed in the second program method rather than the first program method. This is because directly programming data into the free area in the second program method is more efficient than reprogramming the in-place merge operation after the data is programmed into the free area in the first program method.

In the above-described method, the data stored in the first program method in the target block are merged and programmed into a partial area of the target block in the second program method. As the in-place merge operation is recursively performed, the target block BLK is changed from the first memory block programmed in the first program method to the second memory block programmed in the second program method.

Figure 9:
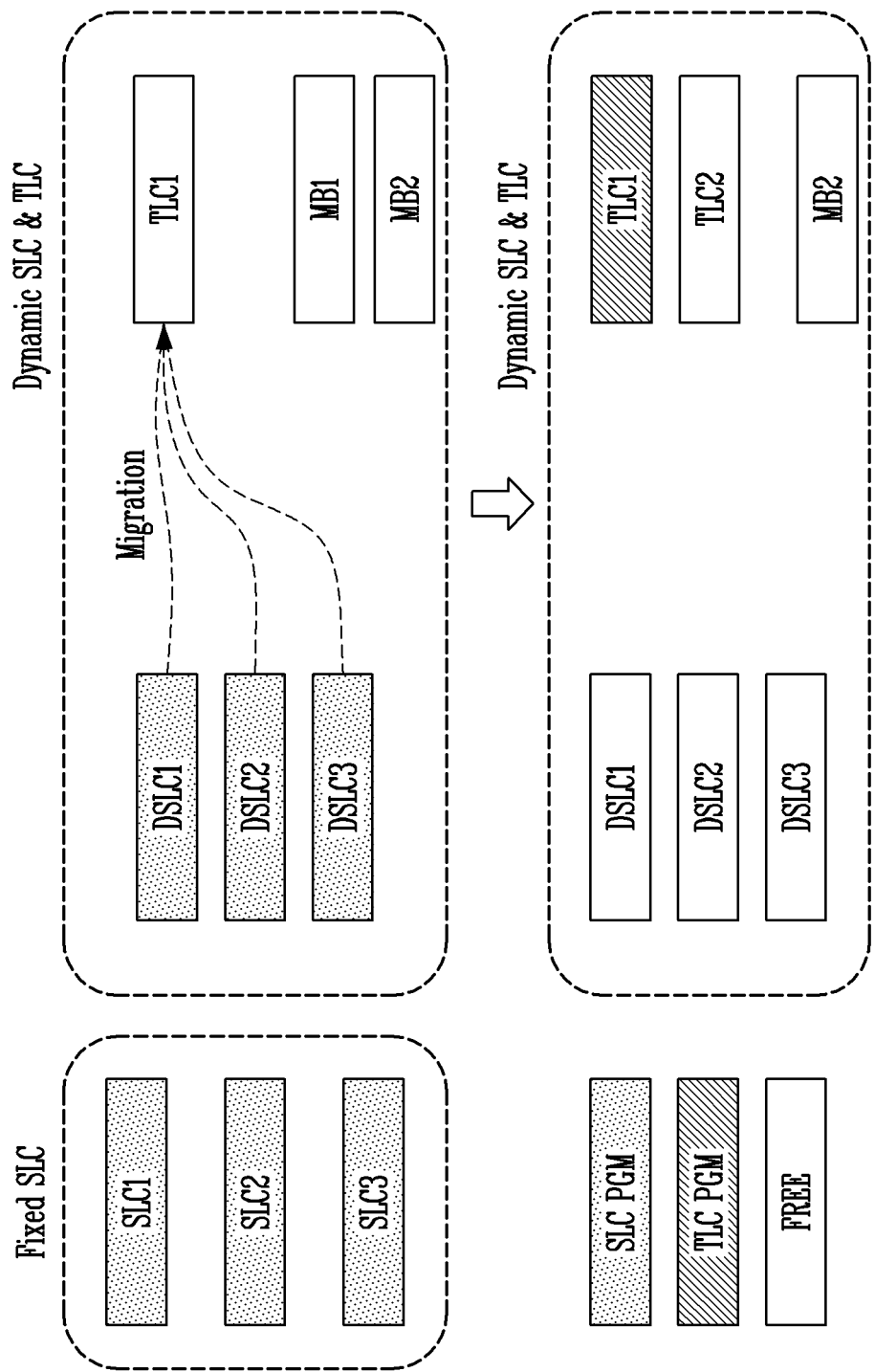
FIG. 9 is a simplified schematic diagram of a migration operation according to an embodiment of the present disclosure.

FIG. 9 is a diagram describing the migration operation according to an embodiment.

Referring to FIG. 9, the memory device may include a first area and a second area.

The first area may include buffer blocks that store data according to the first program method. The second area may include main blocks that store data according to the second program method. The second area may include dynamic buffer blocks that store data by mixing the first program method and the second program method.

The first program method may include one memory cell stores n bits, where n is a natural number equal to or greater than 1. The second program method may include one memory cell storing m bits, where m is a natural number greater than n. In FIG. 9, n is 1 and m is 3.

In FIG. 9, the first area may be a fixed SLC. The number of buffer blocks included in the first area may be fixed for smooth operation of the memory device. The memory blocks SLC1, SLC2, and SLC3 may be buffer blocks. The second area may be dynamic SLC & TLC. The number of dynamic buffer blocks included in the second area may be adjusted according to an operation environment of the memory device. The memory blocks DSLC1, DSLC2, and DSLC3 may be dynamic buffer blocks. The memory blocks TLC1, MB1, and MB2 may be main blocks. The memory blocks MB1 and MB2 may replace the dynamic buffer block DSLC1, DSLC2, and DSLC3.

As the number of available dynamic buffer blocks increases, the read and write speed of the memory device increases, but an available storage space of the memory device may decrease. Therefore, since the over-provisioning area for managing the memory device decreases, reliability and performance of the memory device may become problematic. Accordingly, a maximum number of available dynamic buffer blocks may be set as a threshold number, in consideration of a trade-off relationship between the read and write operation speed, and the reliability of the memory device.

When the number of dynamic buffer blocks reaches the threshold number, the migration operation may be performed. The migration operation may include migrating data stored in the dynamic buffer block to the main block.

In FIG. 9, as an example, the threshold number is three. Since all of the dynamic buffer blocks DSLC1 to DSLC3 corresponding to the threshold number are programmed, data programmed into the dynamic buffer blocks DSLC1 to DSLC3 in the first program method may be migrated to the main block TLC1.

After the migration operation, the dynamic buffer blocks DSLC1 to DSLC3 may be changed to free blocks capable of storing data again.

For the migration operation, the data stored in the dynamic buffer blocks DSLC1 to DSLC3 may be output to the memory controller through the read and write circuit of the memory device. Thereafter, the data output to the memory controller may be again inputted to the read and write circuit of the memory device together with an address of the main block TLC1. The data input through the read and write circuit may be programmed into the main block TLC1.

That is, the migration operation may include a read operation, a data output operation, a data input operation, and a program operation.

Specifically, the read operation for storing data read from a victim block in the read and write circuit of the memory device may be performed, and the data output operation for outputting the data stored in the read and write circuit to the memory controller may be performed. The data input operation in which the data output to the memory controller is again input to the read and write circuit of the memory device may be performed, and the program operation of programming the data input to the read and write circuit to the target block may be performed.

Figure 10A:
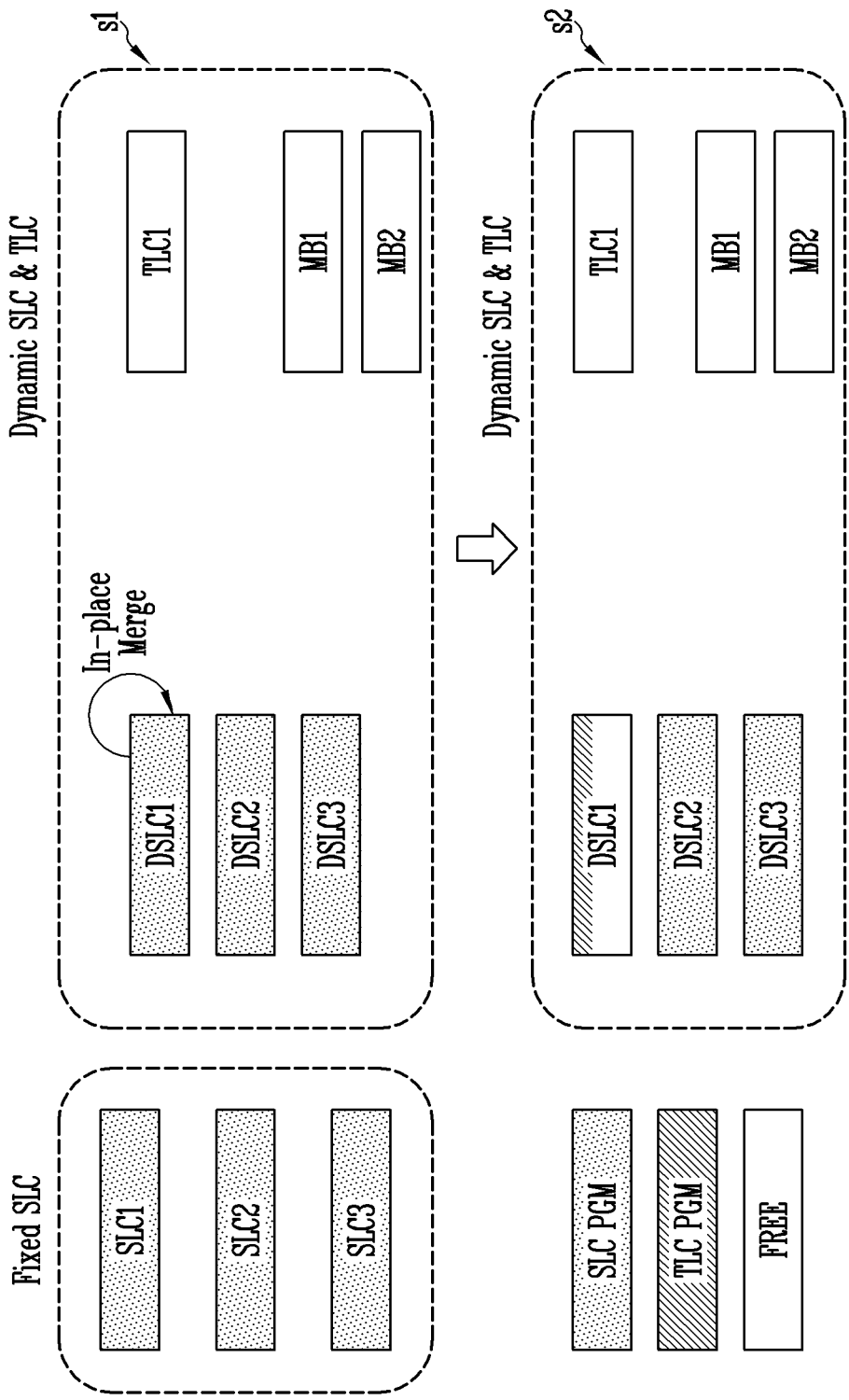
FIGS. 10A and 10B are simplified schematic diagrams describing the in-place merge operation according to an embodiment of the present disclosure.
Figure 10B:
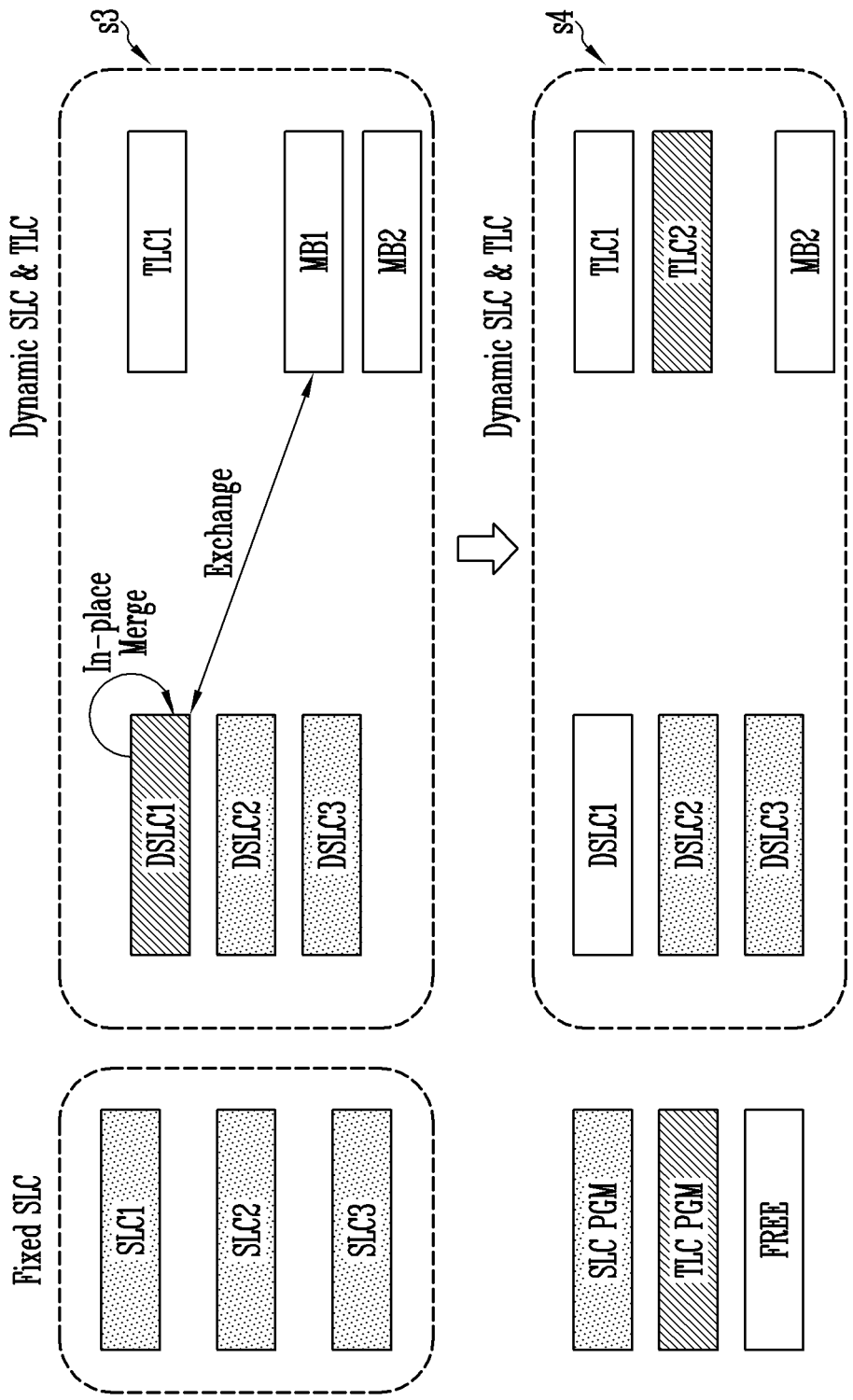

FIGS. 10A and 10B are diagrams describing the in-place merge operation according to an embodiment.

Referring to FIG. 10A, the first program method may include one memory cell stores n bits, where n is a natural number equal to or greater than 1. The second program method may include one memory cell storing m bits, where m is a natural number greater than n. In FIGS. 10A and 10B, n is 1 and m is 3.

In FIGS. 10A and 10B, as an example, the threshold number of the dynamic buffer blocks is three.

In s1, since all of the dynamic buffer blocks DSLC1 to DSLC3 corresponding to the threshold number are programmed, the in-place merge operation may be performed on a selected target block DSLC1 among the dynamic buffer blocks DSLC1 to DSLC3.

In s2, as the in-place merge operation is performed, data programmed into the target block DSLC1 in the first program method may be merged and programmed into a partial area of the target block DSLC1 in the second program method. The remaining area except for the partial area of the target block DSLC1 may be changed to the free area.

After s2, new data may be programmed into the free area of the target block DSLC1 in the first program method, and then, as described with reference to FIG. 8, the in-place merge operation may be recursively performed.

Referring to FIG. 10B, in s3, as the in-place merge operation is performed, the target block DSLC1 may be changed from the first memory block programmed in the first program method to the second memory block programmed in the second program method. Therefore, the target block DSLC1 may be replaced with the memory block MB1. That is, the target block DSLC1 may be newly allocated from the dynamic buffer block to the main block. The memory block MB1 may be newly allocated from the main block to the dynamic buffer block.

In s4, a previous target block may be newly allocated to the main block TLC2. A previous memory block MB1 may be allocated to the new dynamic buffer block DSLC1.

The in-place merge operation may be a data merge operation through the data migration in the same block. The migration operation may be the merge operation through migration of the data stored in the victim block to the target block.

The in-place merge operation according to an embodiment of the present disclosure may be performed through only the read operation and the program operation in the target block and the read and write circuit in the memory device without data input and output operation between the memory controller and the memory device, differently from the migration operation.

Therefore, in a case of the in-place merge operation, merge cost for reducing the number of buffer blocks reaching the threshold number may be reduced in comparison with the migration operation. In addition, since an amount of data merged in one operation performance is less than that of the migration operation, there is an advantage that the free area may be quickly secured. In addition, as described with reference to FIG. 7, the in-place merge operation has an advantage that the update of the mapping table may be simply and quickly performed in comparison with the migration operation.

Figure 11:
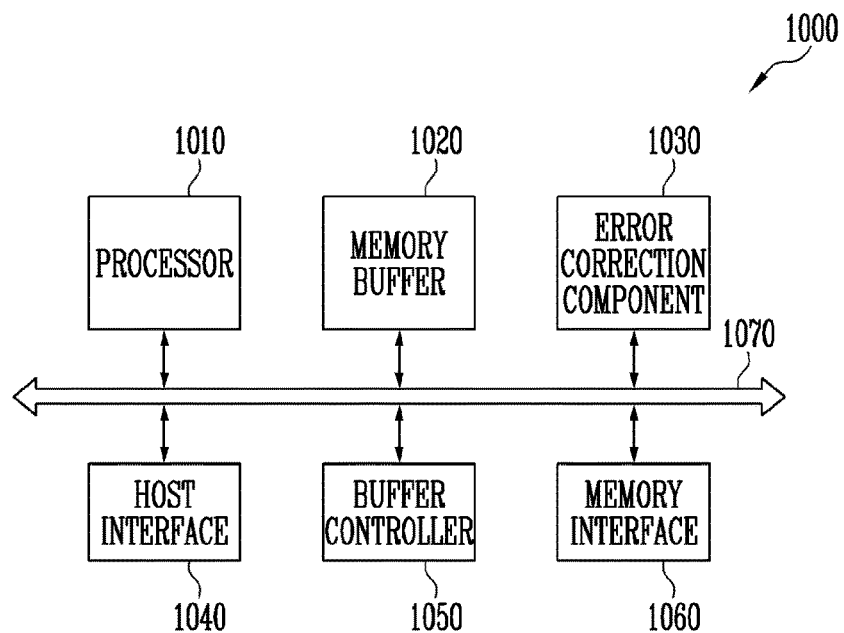
FIG. 11 is a simplified block diagram of another embodiment of the memory controller of FIG. 1.

FIG. 11 is a diagram of another embodiment of the memory controller of FIG. 1.

Referring to FIG. 11, the memory controller 1000 is connected to a host Host and the memory device. The memory controller 1000 is configured to access the memory device in response to the request from the host Host. For example, the memory controller 1000 is configured to control the write, read, erase, and background operations of the memory device. The memory controller 1000 is configured to provide an interface between the memory device and the host Host. The memory controller 1000 is configured to drive firmware for controlling the memory device.

The memory controller 1000 may include a processor 1010, a memory buffer 1020, an error correction component (ECC) 1030, a host interface 1040, a buffer controller 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) using a mapping table and convert the logical block address (LBA) into the physical block address (PBA). An address mapping method of the flash translation layer may include various methods according to a mapping unit. A representative address mapping method includes a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host Host.

In an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction component 1030 may perform error correction. The error correction component 1030 may perform error correction encoding (ECC encoding) based on data to be written to the memory device through memory interface 1060. The error correction encoded data may be transferred to the memory device through the memory interface 1060. The error correction component 1030 may perform error correction decoding (ECC decoding) on the data received from the memory device through the memory interface 1060. For example, the error correction component 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor

1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000, and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the error correction component 1030, and the memory interface 1060. The control bus may be connected to the host interface 1040, the processor 1010, the buffer controller 1050, the memory buffer 1202, and the memory interface 1060.

Figure 12:
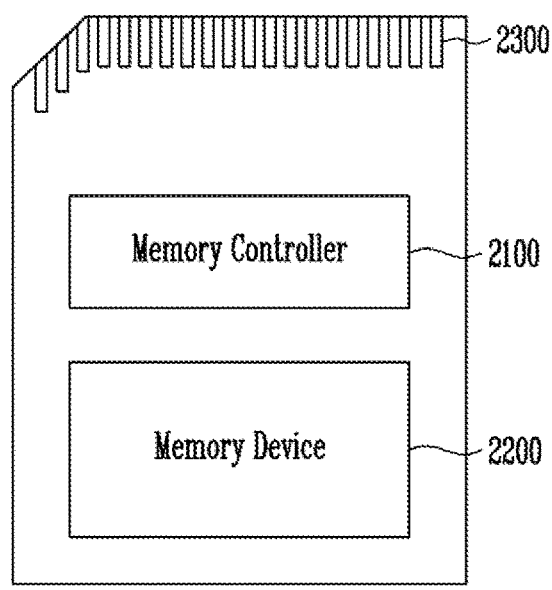
FIG. 12 is a simplified block diagram illustrating a memory card system to which the storage device according to an embodiment of the present disclosure is applied.

FIG. 12 is a block diagram illustrating a memory card system to which the storage device according to an embodiment of the present disclosure is applied.

Referring to FIG. 12, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

For example, the memory controller 2100 may include components such as a random access memory (RAM), a processor, a host interface, a memory interface, and an error correction component.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. For example, the connector 2300 may be defined by at least one of the various communication standards described above.

For example, the memory device 2200 may be configured of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 13:
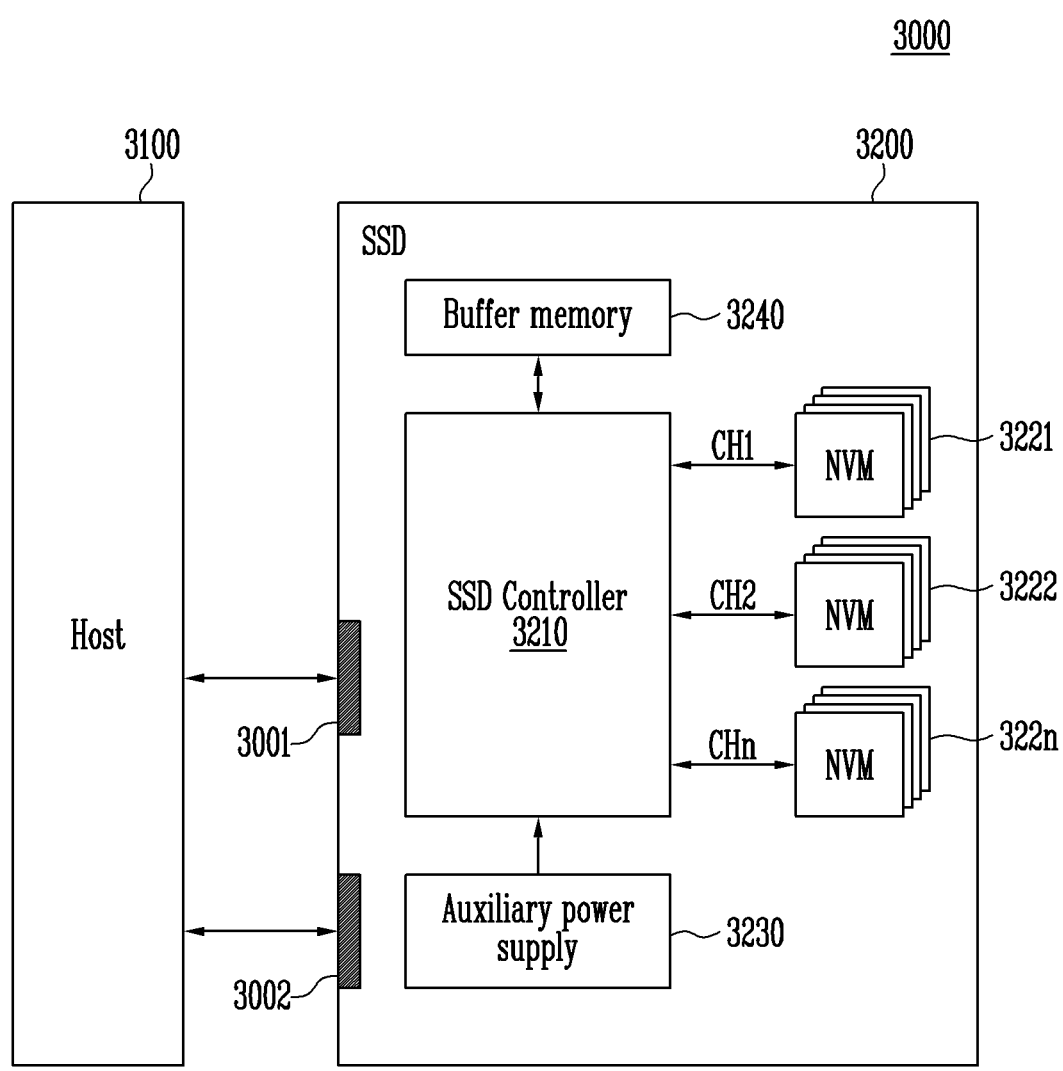
FIG. 13 is a simplified block diagram illustrating a solid-state drive (SSD) system to which the storage device according to an embodiment of the present disclosure is applied.

FIG. 13 is a block diagram illustrating a solid state drive (SSD) system to which the storage device according to an embodiment of the present disclosure is applied.

Referring to FIG. 13, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power supply 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power supply 3230 is connected to the host 3100 through the power connector 3002. The auxiliary power supply 3230 may receive the power PWR from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 14:
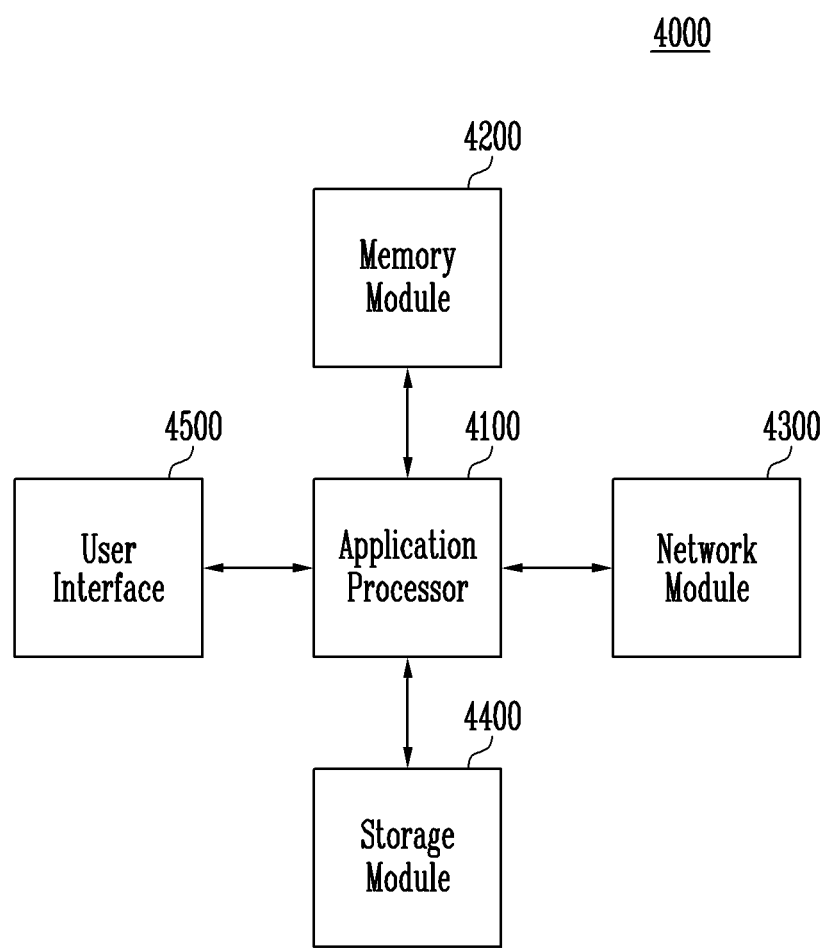
FIG. 14 is a simplified block diagram illustrating a user system to which the storage device according to an embodiment of the present disclosure is applied.

FIG. 14 is a block diagram illustrating a user system to which the storage device according to an embodiment of the present disclosure is applied.

Referring to FIG. 14, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
    a memory block including a plurality of physical pages;
    a peripheral circuit including a read and write circuit configured to perform a read operation and a program operation on a selected physical page among the plurality of physical pages; and
    a control logic configured to control the peripheral circuit to read first logical page data stored in a first physical page and second logical page data stored in a second physical page among the plurality of physical pages, store the first logical page data and the second logical page data in the read and write circuit, and program the second logical page data into the first physical page using the first and second logical page data stored in the read and write circuit,
    wherein an area of both the first physical page and the second physical page is equal to or smaller than a section of the memory device.

2. The memory device of claim 1, wherein the read and write circuit is configured to store logical page data read from the selected physical page or logical page data to be programmed into the selected physical page.

3. The memory device of claim 2, wherein the read and write circuit comprises:
    a first page latch configured to store the first logical page data read from the first physical page; and
    a second page latch configured to store the second logical page data read from the second physical page.

4. The memory device of claim 3, wherein the control logic controls the peripheral circuit to store merged data of the first and second logical page data in the first physical page, using the first and second logical page data stored in the first and second page latches.

5. The memory device of claim 1, wherein the control logic controls the peripheral circuit to erase a sub block including the first physical page among sub blocks included in the memory block.

6. The memory device of claim 1, wherein the control logic controls the peripheral circuit to read third logical page data stored in a third physical page among the plurality of physical pages, and program the second and third logical page data into the first physical page using the read first to third logical page data.

7. A memory device comprising:
    a memory block;
    a peripheral circuit configured to perform a read operation and a program operation on the memory block; and
    a control logic configured to control the peripheral circuit to program first data, which is stored in a first area of the memory block in a first program method, into a portion of the first area of the memory block in a second program method,
    wherein the first program method is a program method of storing n bits per memory cell, where n is a natural number equal to or greater than 1,
    wherein the second program method is a program method of storing m bits per memory cell, where m is a natural number greater than n,
    wherein the first area includes a plurality of pages and the portion of the first area includes at least one page among the plurality of pages, and
    wherein the first area is equal to or smaller than a section of the memory device.

8. The memory device of claim 7, wherein the control logic controls the peripheral circuit to erase a remaining second area except for the first area in the memory block.

9. The memory device of claim 8, wherein the control logic controls the peripheral circuit to program second data into the second area in the first program method.

10. The memory device of claim 9, wherein the control logic controls the peripheral circuit to program the second data stored in the second area into a third area that is a portion of the second area in the second program method.

11. The memory device of claim 10, wherein the control logic controls the peripheral circuit to erase a remaining fourth area except for the third area in the second area, and program third data into the fourth area in the first program method.

12. A storage device comprising:
   a memory device including a plurality of memory blocks; and
   a memory controller configured to control the memory device to perform an in-place merge operation of programming first data stored in a first area of a target block in a first program method among the plurality of memory blocks into a portion of the first area in a second program method, based on a number of first memory blocks programmed in the first program method among the plurality of memory blocks,
   wherein the first program method is a program method of storing n bits per memory cell, where n is a natural number equal to or greater than 1,
   wherein the second program method is a program method of storing m bits per memory cell, where m is a natural number greater than n,
   wherein the first area includes a plurality of pages and the portion of the first area includes at least one page among the plurality of pages, and
   wherein the first area is equal to or smaller than a section of the memory device.

13. The storage device of claim 12, wherein the memory device comprises a read and write circuit configured to perform a read operation or a program operation on the plurality of memory blocks.

14. The storage device of claim 13, wherein the memory controller comprises:
   a block information manager configured to manage information on the first memory blocks;
   a merge controller configured to control the in-place merge operation based on the number of the first memory blocks;
   a command controller configured to provide the memory device with a command for performing the in-place merge operation under control of the merge controller; and
   a map manager configured to store a mapping table related to the first memory blocks.

15. The storage device of claim 14, wherein when the number of the first memory blocks reaches a threshold number, the merge controller provides the command controller with information on the target block on which the in-place merge operation is to be performed.

16. The storage device of claim 14, wherein the command controller provides the memory device with a read command for reading the first data from the target block to the read and write circuit, and provides the memory device with a program command for programming the first data, which is read in the read and write circuit, into the first area of the target block in the second program method.

17. The storage device of claim 16, wherein the command controller provides the memory device with an erase command for a remaining second area except for the first area in the target block.

18. The storage device of claim 17, wherein the command controller provides the memory device with a program command for storing second data in the second area in the first program method.

19. The storage device of claim 17, wherein when a size of the second area is less than a threshold size, the command controller provides the memory device with a program command for storing second data in the second area in the second program method.

20. The storage device of claim 14, wherein when the in-place merge operation is performed, the map manager updates a physical address mapped with a logical address of the first data in the mapping table.

* * * * *